(12) United States Patent
Ahn et al.

(10) Patent No.: US 10,497,858 B1
(45) Date of Patent: Dec. 3, 2019

(54) METHODS FOR FORMING STRUCTURES FOR MRAM APPLICATIONS

(71) Applicant: Applied Materials, Inc., Santa Clara, CA (US)

(72) Inventors: Jaesoo Ahn, San Jose, CA (US); Hsin-wei Tseng, San Jose, CA (US); Lin Xue, San Jose, CA (US); Mahendra Pakala, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/230,563

(22) Filed: Dec. 21, 2018

(51) Int. Cl.
*H01L 43/02* (2006.01)
*G11C 11/16* (2006.01)
*H01L 27/22* (2006.01)
*H01L 43/12* (2006.01)

(52) U.S. Cl.
CPC ............ *H01L 43/02* (2013.01); *G11C 11/161* (2013.01); *H01L 27/222* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 6,964,928 B2 | 11/2005 | Ying et al. | |
| 7,750,421 B2 | 7/2010 | Horng et al. | |
| 9,028,910 B2 | 5/2015 | Zhou et al. | |
| 10,069,064 B1* | 9/2018 | Haq | H01L 43/02 |
| 10,205,089 B2* | 2/2019 | Kim | H01L 43/08 |
| 2004/0101978 A1 | 5/2004 | Linn et al. | |
| 2011/0194341 A1* | 8/2011 | Gaidis | G11C 11/16 365/171 |
| 2013/0119494 A1* | 5/2013 | Li | H01L 43/08 257/421 |
| 2013/0175644 A1 | 7/2013 | Horng et al. | |
| 2015/0255507 A1 | 9/2015 | Pakala et al. | |
| 2016/0149123 A1* | 5/2016 | Park | H01J 37/32357 438/3 |
| 2016/0351799 A1 | 12/2016 | Xue et al. | |
| 2018/0040668 A1* | 2/2018 | Park | G11C 11/161 |
| 2019/0013353 A1* | 1/2019 | Lee | H01L 43/08 |

* cited by examiner

*Primary Examiner* — J. E. Schoenholtz

(74) *Attorney, Agent, or Firm* — Patterson + Sheridan, LLP

(57) ABSTRACT

Embodiments of the disclosure provide methods and apparatus for fabricating magnetic tunnel junction (MTJ) structures on a substrate for MRAM applications, particularly for spin-orbit-torque magnetic random access memory (SOT MRAM) applications. In one embodiment, a magnetic tunnel junction (MTJ) device structure includes a magnetic tunnel junction (MTJ) pillar structure disposed on a substrate, and a gap surrounding the MTJ pillar structure. In yet another embodiment, a magnetic tunnel junction (MTJ) device structure includes a spacer layer surrounding a patterned reference layer and a tunneling barrier layer disposed on a patterned free layer, and a gap surrounding the patterned free layer.

18 Claims, 13 Drawing Sheets

TO FIGURE 5A          TO FIGURE 4E

METHODS FOR FORMING STRUCTURES FOR MRAM APPLICATIONS

FIELD

Embodiments of the disclosure relate to methods for fabricating structures used in magnetoresistive random access memory (MRAM) applications. More specifically, embodiments of the disclosure relate to methods for fabricating magnetic tunnel junction structures for MRAM applications.

BACKGROUND

Magnetoresistive random access memory (MRAM) is a type of memory device containing an array of MRAM cells that store data using their resistance values instead of electronic charges. Generally, each MRAM cell includes a magnetic tunnel junction (MTJ) structure. The MTJ structure may have adjustable resistance to represent a logic state "0" or "1." The MTJ structure typically includes a stack of magnetic layers having a configuration in which two ferromagnetic layers are separated by a thin non-magnetic dielectric, e.g., an insulating tunneling layer. A top electrode and a bottom electrode are utilized to sandwich the MTJ structure so electric current may flow between the top and the bottom electrode.

One ferromagnetic layer, e.g., a reference layer, is characterized by a magnetization with a fixed direction. The other ferromagnetic layer, e.g., a storage layer, is characterized by a magnetization with a direction that is varied upon writing of the device, such as by applying a magnetic field. In some devices, an insulator material, such as a dielectric oxide layer, may be formed as a thin tunneling barrier layer sandwiched between the ferromagnetic layers. The layers are typically deposited sequentially as overlying blanketed films. The ferromagnetic layers and the insulator material are subsequently patterned by various etching processes in which one or more layers are removed, either partially or totally, in order to form a device feature.

When the respective magnetizations of the reference layer and the storage layer are antiparallel, a resistance of the magnetic tunnel junction is high having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which is derived from a reference cell or a group of reference cells and represents an in-between resistance value between that of the high logic state "1" and the low logic state "0".

Spin-transfer-torque magnetic random access memory (STT MRAM) and spin-orbit-torque magnetic random access memory (SOT MRAM) are different chip architectures that each has its own electrical performance and energy efficiency. Spin-orbit-torque magnetic random access memory (SOT MRAM) has been wildly studied for MRAM applications. However, external or internal generated magnetic field is also required when operating the spin-orbit-torque magnetic random access memory (SOT MRAM). However, such requirement often complicates the manufacturing process as well as increasing the manufacturing cost. Thus, how to fabricate spin-orbit-torque magnetic random access memory (SOT MRAM) with relatively simple structure as well as low manufacturing cost remains a challenge.

Therefore, there is a need in the art for improved methods and apparatus for fabricating MTJ structures for MRAM applications.

SUMMARY

Embodiments of the disclosure provide methods and apparatus for fabricating magnetic tunnel junction (MTJ) structures on a substrate for MRAM applications, particularly for spin-orbit-torque magnetic random access memory (SOT MRAM) applications. In one embodiment, a magnetic tunnel junction (MTJ) device structure includes a magnetic tunnel junction (MTJ) pillar structure disposed on a substrate, and a gap surrounding the MTJ pillar structure.

In another embodiment, a method for forming a magnetic tunnel junction (MTJ) device structure includes patterning a film stack comprising a reference layer, a tunneling barrier layer and a free layer disposed on the tunneling barrier, patterning the reference layer and the tunneling barrier layer until the free layer is exposed, forming a spacer layer covering sidewalls of the patterned reference layer and the tunneling barrier layer, forming a dielectric layer on the spacer layer covering the spacer layer, forming a passivation layer covering the dielectric layer, and selectively etching a portion of the passivation layer and the dielectric layer to form a gap surrounding the film stack.

In yet another embodiment, a magnetic tunnel junction (MTJ) device structure includes a spacer layer surrounding a patterned reference layer and a tunneling barrier layer disposed on a patterned free layer, and a gap surrounding the patterned free layer.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings.

To facilitate understanding, identical reference numerals have been used, where possible, to designate identical elements that are common to the figures. It is contemplated that elements disclosed in one embodiment may be beneficially utilized on other embodiments without specific recitation.

It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure generally provide apparatus and methods for forming a MTJ structure disposed on a substrate for MRAM applications. The embodiments of the disclosure may be used suitable MRAM applications, particularly in spin-orbit-torque magnetic random access memory (SOT MRAM) applications. In one embodiment, the MTJ structure as described herein has a gap (e.g., a discontinued free layer or an air gap) defined adjacent to the MTJ structure to the nearby film layers so that a stray magnetic field may be provided to the isolated MTJ pillar structure. By doing so, an intrinsic magnetic field may be generated by a discontinuous free layer disposed in the film structure. Thus, an external magnetic field generation may be eliminated, thus reducing manufacturing cost and complexity.

Figure 1:
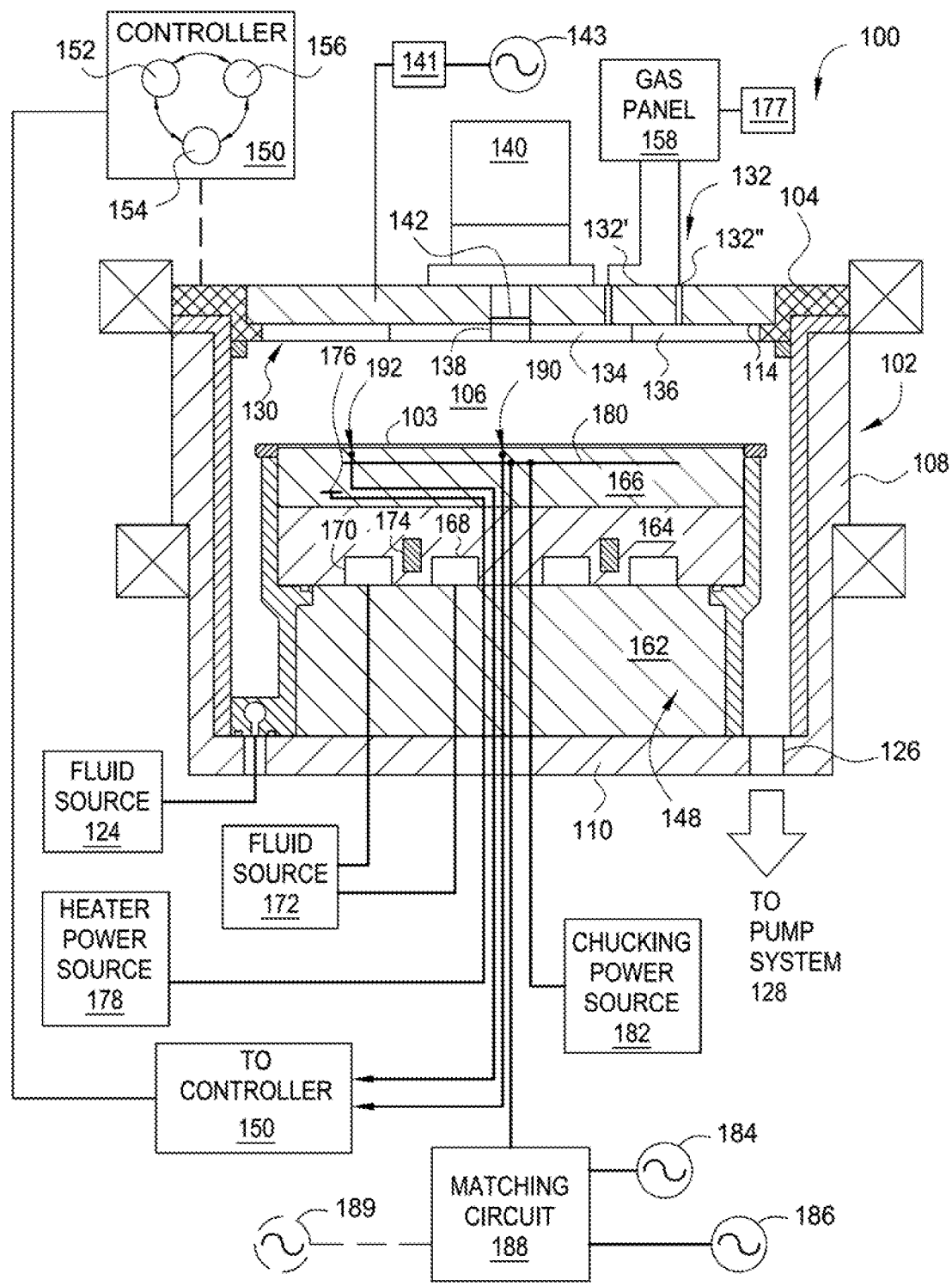
FIG. 1 depicts one embodiment of a processing chamber for practice one embodiment of the present disclosure.

FIG. 1 is a sectional view of one example of a processing chamber 100 suitable for performing a patterning process to etch a film stack disposed on a substrate. Suitable processing chambers that may be adapted for use with the teachings disclosed herein include, for example, an ENABLER®, C3® or AdvantEdge Mesa® processing chamber available from Applied Materials, Inc. of Santa Clara, Calif. Although the processing chamber 100 is shown including a plurality of features that enable superior etching performance, it is contemplated that other processing chambers may be adapted to benefit from one or more of the inventive features disclosed herein.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one implementation, the pump system 128 maintains the pressure inside the interior volume 106 at operating pressures typically between about 10 mTorr to about 500 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one implementation, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the disclosure is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100. In one implementation, the gas panel 158 is adapted to provide fluorinated process gas through the inlet ports 132', 132" and into the interior volume 106 of the processing chamber 100. In one implementation, the process gas provided from the gas panel 158 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, CO, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include HCl, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

A remote plasma source 177 may be optionally coupled to the gas panel 158 to facilitate dissociating gas mixture from a remote plasma prior to entering into the interior volume 106 for processing. A RF source power 143 is coupled through a matching network 141 to the showerhead assembly 130. The RF source power 143 typically is capable of producing up to about 3000 W at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected back to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the lid 104.

In one implementation, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through separate inlet ports 132', 132".

The substrate support pedestal assembly 148 is disposed in the interior volume 106 of the processing chamber 100 below the gas distribution (showerhead) assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

In one implementation, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises at least one clamping electrode 180 for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum or gravity.

At least one of the base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further comprise a plurality of gas passages (not shown), such as grooves, that are formed in a substrate support pedestal supporting surface of the chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 103.

In one implementation, the substrate support pedestal assembly 148 is configured as a cathode and includes an electrode 180 that is coupled to a plurality of RF power bias sources 184, 186. The RF bias power sources 184, 186 are coupled between the electrode 180 disposed in the substrate support pedestal assembly 148 and another electrode, such as the showerhead assembly 130 or ceiling (lid 104) of the chamber body 102. The RF bias power excites and sustains a plasma discharge formed from the gases disposed in the processing region of the chamber body 102.

In the example depicted in FIG. 1, the dual RF bias power sources 184, 186 are coupled to the electrode 180 disposed in the substrate support pedestal assembly 148 through a matching circuit 188. The signal generated by the RF bias power sources 184, 186 is delivered through matching circuit 188 to the substrate support pedestal assembly 148 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. An additional bias power source 189 may be coupled to the electrode 180 to control the characteristics of the plasma.

In one mode of operation, the substrate 103 is disposed on the substrate support pedestal assembly 148 in the plasma processing chamber 100. A process gas and/or gas mixture is introduced into the chamber body 102 through the showerhead assembly 130 from the gas panel 158. A vacuum pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing chamber 100 are handled through numerous signal cables.

Figure 2:
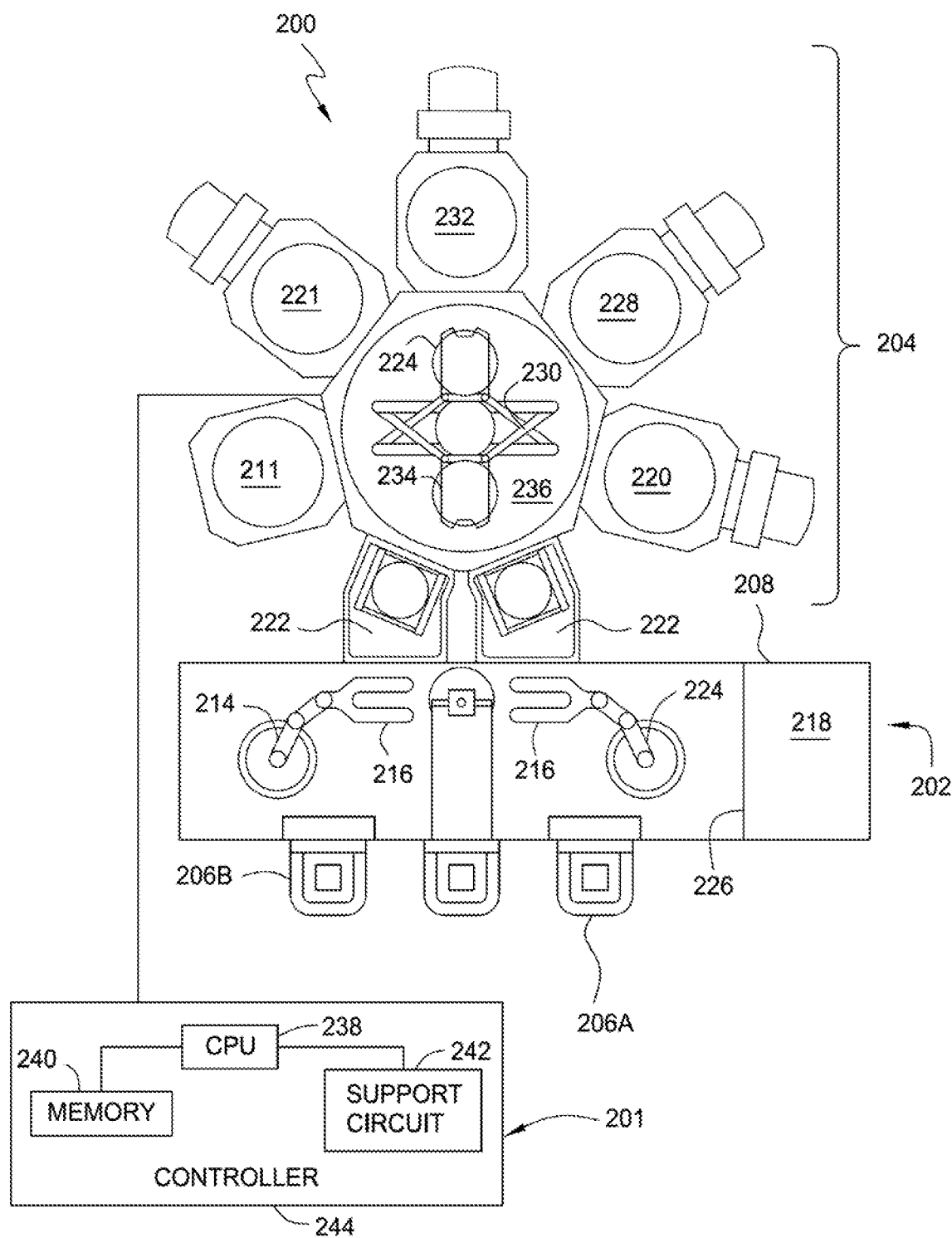
FIG. 2 depicts another embodiment of a cluster processing system for practice one embodiment of the present disclosure.

FIG. 2 is a schematic, top plan view of an exemplary cluster processing system 200 that includes one or more of the processing chambers 211, 221, 232, 228, 100 that are incorporated and integrated therein. In one embodiment, the cluster processing system 200 may be a Centura® or Endura® integrated processing system, commercially available from Applied Materials, Inc., located in Santa Clara, Calif. It is contemplated that other processing systems (including those from other manufacturers) may be adapted to benefit from the disclosure.

The cluster processing system 200 includes a vacuum-tight processing platform 204, a factory interface 202, and a system controller 244. The platform 204 includes a plurality of processing chambers 211, 221, 232, 228, 100 and at least one load-lock chamber 222 that is coupled to a vacuum substrate transfer chamber 236. Two load lock chambers 222 are shown in FIG. 2. The factory interface 202 is coupled to the transfer chamber 236 by the load lock chambers 222.

In one embodiment, the factory interface 202 comprises at least one docking station 208 and at least one factory interface robot 214 to facilitate transfer of substrates. The docking station 208 is configured to accept one or more front opening unified pod (FOUP). Two FOUPS 206A-B are shown in the embodiment of FIG. 2. The factory interface robot 214 having a blade 216 disposed on one end of the robot 214 is configured to transfer the substrate from the factory interface 202 to the processing platform 204 for processing through the load lock chambers 222. Optionally, one or more metrology stations 218 may be connected to a terminal 226 of the factory interface 202 to facilitate measurement of the substrate from the FOUPS 206A-B.

Each of the load lock chambers 222 have a first port coupled to the factory interface 202 and a second port coupled to the transfer chamber 236. The load lock chambers 222 are coupled to a pressure control system (not shown) which pumps down and vents the load lock chambers 222 to facilitate passing the substrate between the vacuum environment of the transfer chamber 236 and the substantially ambient (e.g., atmospheric) environment of the factory interface 202.

The transfer chamber 236 has a vacuum robot 230 disposed therein. The vacuum robot 230 has a blade 234 capable of transferring substrates 224 among the load lock chambers 222, the metrology system 210 and the processing chambers 211, 221, 232, 228, 100.

In one embodiment of the cluster processing system 200, the cluster processing system 200 may include one or more processing chambers 211, 221, 232, 228, 100, which may be a deposition chamber (e.g., physical vapor deposition chamber, chemical vapor deposition, or other deposition chambers), annealing chamber (e.g., high pressure annealing chamber, RTP chamber, laser anneal chamber), etch chamber, cleaning chamber, curing chamber, lithographic exposure chamber, or other similar type of semiconductor processing chambers. In some embodiments of the cluster processing system 200, one or more of processing chambers 211, 221, 232, 228, 100, the transfer chamber 236, the factory interface 202 and/or at least one of the load lock chambers 222.

The system controller 244 is coupled to the cluster processing system 200. The system controller 244, which may include the computing device 201 or be included within the computing device 201, controls the operation of the cluster processing system 200 using a direct control of the processing chambers, 221, 232, 228, 100 of the cluster processing system 200. Alternatively, the system controller 244 may control the computers (or controllers) associated with the processing chambers 211, 221, 232, 228, 220 and the cluster processing system 200. In operation, the system controller 244 also enables data collection and feedback from the respective chambers to optimize performance of the cluster processing system 200.

The system controller 244, much like the computing device 201 described above, generally includes a central processing unit (CPU) 238, a memory 240, and support circuits 242. The CPU 238 may be one of any form of a general purpose computer processor that can be used in an industrial setting. The support circuits 242 are conventionally coupled to the CPU 238 and may comprise cache, clock circuits, input/output subsystems, power supplies, and the like. The software routines transform the CPU 238 into a specific purpose computer (controller) 244. The software routines may also be stored and/or executed by a second controller (not shown) that is located remotely from the cluster processing system 200.

Figure 3:
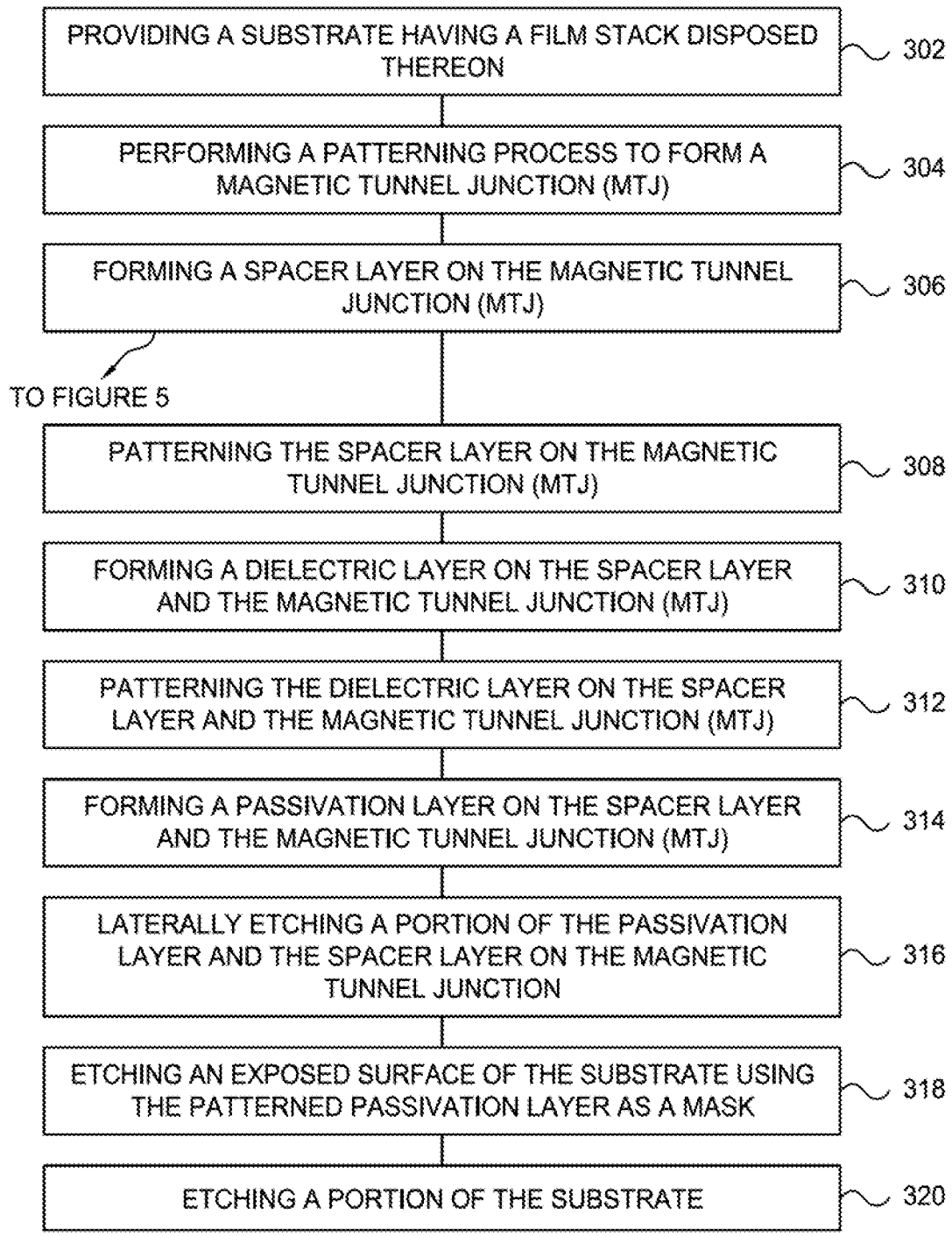
FIG. 3 depicts a flow diagram illustrating a method for fabricating magnetic tunnel junction (MTJ) structures along with a back end interconnection structure according to one embodiment of the present disclosure.

FIG. 3 depicts a flow diagram illustrating a process 300 for manufacturing MTJ structures on a substrate for MRAM applications according to one embodiment of the present disclosure. It is noted that the process 300 for manufacturing MTJ structures may be utilized in spin-orbit-torque magnetic random access memory (SOT MRAM), spin-transfer-torque magnetic random access memory (STT MRAM), and/or the hybrid (or called integrated) spin-orbit-torque magnetic spin-transfer-torque magnetic random access memory (SOT-STT MRAM) applications, particularly in spin-orbit-torque magnetic random access memory (SOT MRAM). FIGS. 4A-4J are schematic cross-sectional views of MTJ structure formed on a substrate 402 at various stages of the process of FIG. 3. It is contemplated that the process 300 may be performed in suitable processing chambers, such as the plasma processing chamber 100 depicted in FIG. 1 or other suitable processing chambers including deposition chambers, patterning chambers or other suitable processing chambers incorporated in the cluster processing systems 200 depicted in FIG. 2. It is also noted that the process 300 may be performed in suitable processing chambers, including those from other manufacturers.

Figure 4A:
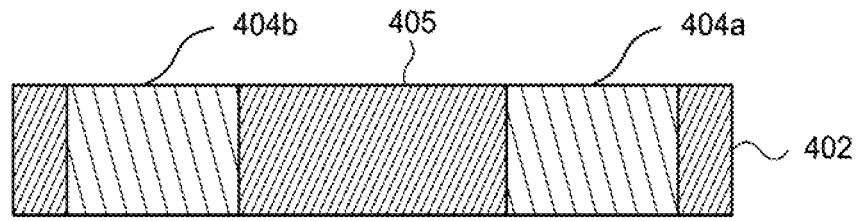
FIGS. 4A-4J are cross sectional views of a substrate at various stages of the method of FIG. 3.

The process 300 begins at operation 302 by providing a substrate, such as the substrate 402 having an interconnection structure, shown as 404a, 404b, formed in an insulating structure 405, as shown in FIG. 4A. The interconnection structure 404a, 404b and the insulating structure 405 may be formed in one or more of the processing chambers incorporated in the cluster processing system 200 depicted in FIG. 2. In one embodiment, the interconnection structure 404a, 404b and the insulating structure 405 may be further formed on a base (not shown) comprising metal or glass, silicon, dielectric bulk material and metal alloys or composite glass, crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The base may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter base substrate.

The insulating structure 405 may comprise a dielectric material, such as SiN, SiCN, $SiO_2$, SiON, SiC, amorphous carbon, SiOC or other suitable low dielectric constant material and the like. The interconnection structure 404a, 404b includes a metal containing material, such as aluminum, tungsten, copper, nickel, tantalum, titanium, and the like. In one example, the insulating structure 405 includes a low dielectric constant dielectric material, such as SiOC, and the interconnection structure 404a, 404b includes copper.

Figure 4B:
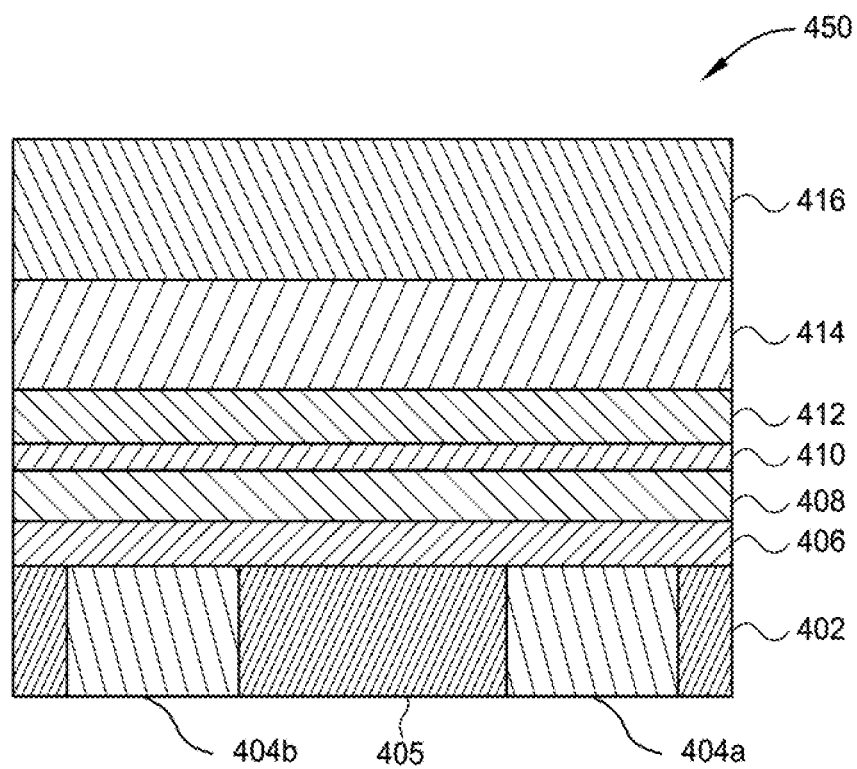

At operation 304, a film stack 450 is disposed on the substrate 402, as shown in FIG. 4B. The film stack 450 may be formed in one or more of the processing chambers incorporated in the cluster processing system 200 depicted in FIG. 2. The film stack 450 further includes a spin-orbit-torque (SOT) layer 406, a free layer 408 and a reference layer 412 sandwiching a tunneling barrier layer 410 sequentially formed on the substrate 402. A synthetic antiferromagnetic free (SAF) layer 414 is then formed on the reference layer 412 followed by a hardmask layer 416. Though the film stack 450 described in FIGS. 4B-4J only includes six layers, it is noted that additional or multiple film layers can be further formed in the film stack 450 as needed. The tunneling barrier layer 410 may be an oxide barrier layer in the case of a tunnel junction magnetoresistive (TMR) sensor or a conductive layer in the case of a giant magnetoresistive (GMR) sensor. When the film stack 450 is configured to form a TMR sensor, then the tunneling barrier layer 410 may comprise MgO, $HfO_2$, $TiO_2$, $TaO_x$, $Al_2O_3$, or other suitable materials. In the embodiment depicted in FIGS. 4B-4J, the tunneling barrier layer 410 may comprise MgO having a thickness of about 1 to about 25 Angstroms, such about 10 Angstroms.

The free layer 408 and the reference layer 412 may be a metal containing material or a magnetic material, such as Mo, Ir, Ru, Ta, MgO, Hf, Fe, CoFe, CoFeB and the like. It is noted that the free layer 408 and the reference layer 412 may be fabricated from the same or different materials as needed. The SOT layer 406, the synthetic antiferromagnetic free (SAF) layer 414 and the hardmask layer 416 are fabricated from CoFeB, MgO, Ta, W, Pt, CuBi, Mo, Ru, Ir, alloys thereof, or combinations thereof. The hardmask layer 416 is disposed in the film stack 450 and will be later utilized as an etching mask layer during the following patterning and/or etching process.

Figure 4C:
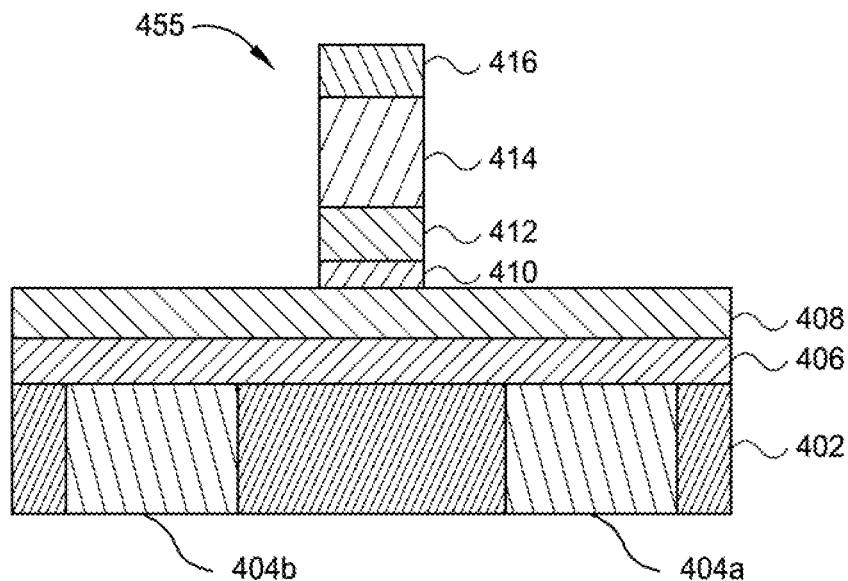

At operation 304, a first patterning process, e.g., an etching process, is first performed to pattern the hardmask layer 416 followed by a second patterning process to pattern (e.g., etch) the film stack 450 exposed by the patterned hardmask layer 416 form part of a magnetic tunnel junction (MTJ) structure 455, as shown in FIG. 4C, until a surface of the free layer 408 is exposed. The first and second patterning processes may be performed in the processing chamber 100 depicted in FIG. 1, which is incorporated in the cluster processing system 200 depicted in FIG. 2, or be performed in one or more of the processing chambers incorporated in the cluster processing system 200. It is noted that the patterned hardmask layer 416 is intended to be left and remained on the film stack 450, forming as part of the magnetic tunnel junction (MTJ) structure 455 after the patterning process performed at operation 304. The first and the second patterning process for patterning the film stack 450 may include several steps or different recipes configured to supply different gas mixtures or etchants to etch different layers in accordance with the materials included in each layer.

During patterning, an etching gas mixture or several gas mixtures with different etching species are sequentially supplied into the substrate surface to remove the portion of the film stack 450 until the free layer 408.

The end point of the patterning process at operation 304 may be controlled by time or other suitable method. For example, the patterning process may be terminated after performing for between about 200 seconds and about 10 minutes until the free layer 408 is exposed, as shown in FIG. 4C. The patterning process may be terminated by determination from an endpoint detector, such as an OES detector or other suitable detector as needed.

It is noted that although the profile of the partly formed magnetic tunnel junction (MTJ) structure 455 as formed after patterning the film stack 450 has a vertical sidewall, it is noted that the magnetic tunnel junction (MTJ) structure 455 may have other profiles, such as tapered profiles or any suitable sidewall profiles with desired slopes as needed.

Figure 4D:
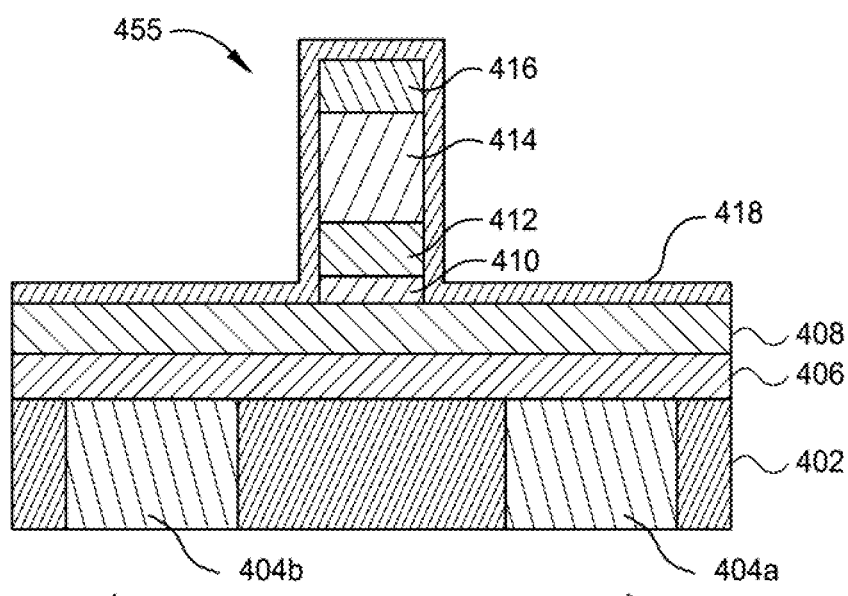

At operation 306, a deposition process is performed to form a spacer layer 418 covering the partly formed magnetic tunnel junction (MTJ) structure 455, as shown in FIG. 4D. The spacer layer 418 may be formed in one or more of the processing chambers incorporated in the cluster processing system 200 depicted in FIG. 2. The spacer layer 418 may be a dielectric layer, such as a SiN, SiOC, SiON, SiOC, SiO$_2$, SiC, amorphous carbon, or other suitable insulating materials as needed. In one example, the spacer layer 418 is a silicon nitride or silicon carbon nitride layer.

The spacer layer 418 is conformally formed on the substrate 402 covering the magnetic tunnel junction (MTJ) structure 455 as well as the exposed free layer 408. The spacer layer 418 has a thickness between about 3 nm and about 30 nm.

Figure 4E:
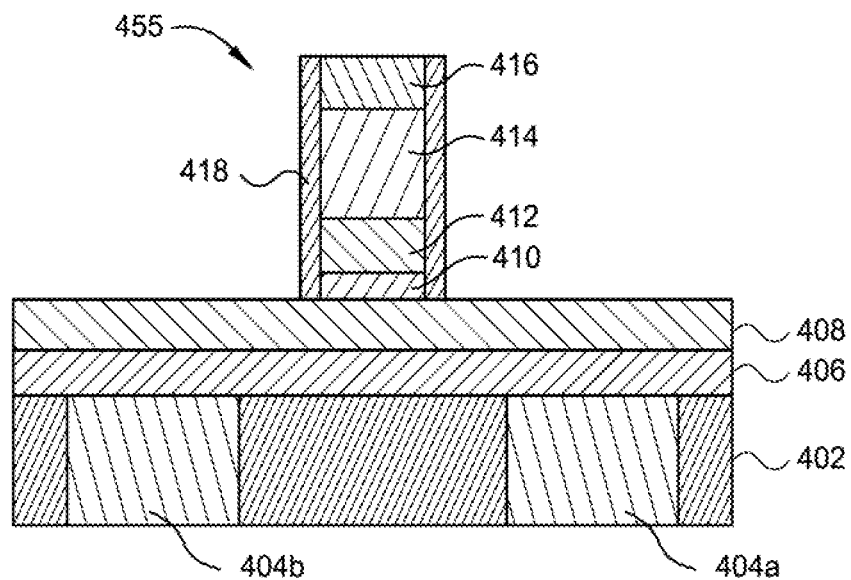

At operation 308, a patterning process is performed to pattern the spacer layer 418, as shown in FIG. 4E. The spacer layer 418 is patterned so remove the spacer layer 418 from a top surface of the hardmask layer 416 and the top surface of the free layer 408. Thus, after the patterning process at operation 308, the spacer layer 418 is selectively formed on the sidewalls of the magnetic tunnel junction (MTJ) structure 455. The spacer layer 418 may be later formed as a sidewall protection structure when the manufacturing process of the magnetic tunnel junction (MTJ) structure 455 is completed.

Figure 4F:
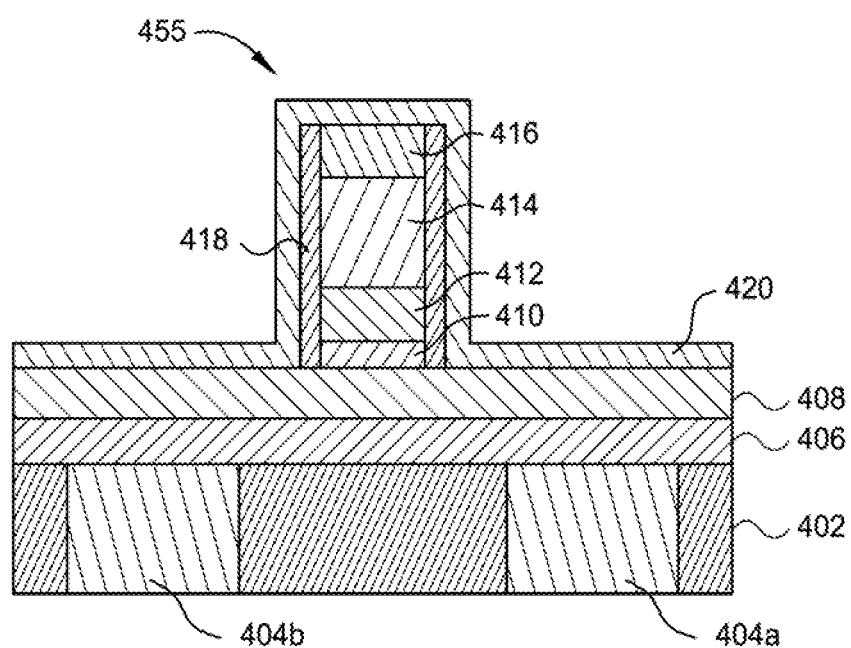

At operation 310, a dielectric layer 420 is then conformally formed on the spacer layer 418 as well as the exposed surfaces of the hardmask layer 416 and the free layer 408, as shown in FIG. 4F. The dielectric layer 420 may be a silicon oxide layer that may be utilized to provide an enhanced protection to the sidewalls of the magnetic tunnel junction (MTJ) structure 455 during the following patterning processes. In one example, the dielectric layer 420 may be an insulating material, such as a SiN, SiOC, SiON, SiOC, SiO$_2$, SiC amorphous carbon, or other suitable insulating materials as needed. In one example, the dielectric layer 420 is fabricated from a material different from the spacer layer 418. In one example, the dielectric layer 420 is a silicon oxide layer while the spacer layer 418 is a silicon nitride layer.

Figure 4G:
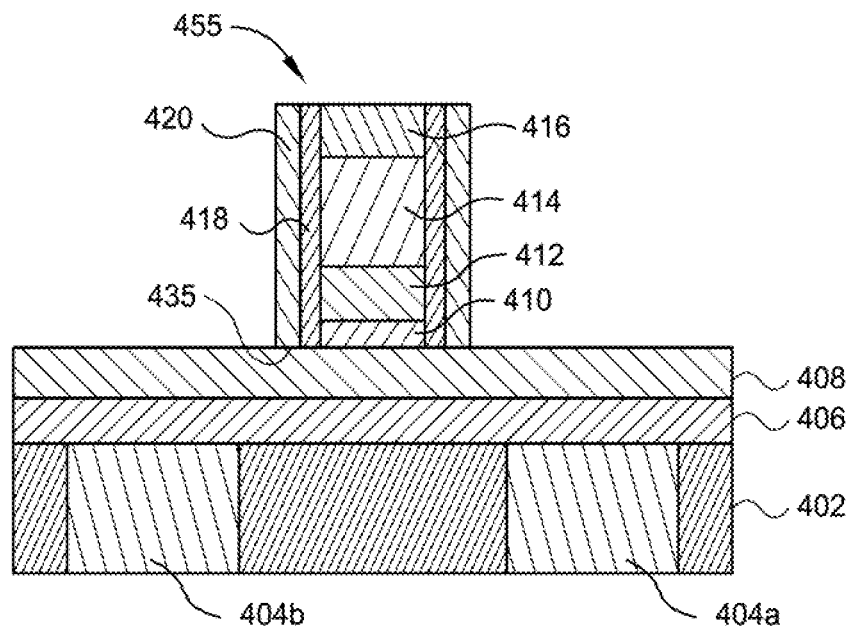

At operation 312, a patterning process is performed to remove part of the dielectric layer 420 from the magnetic tunnel junction (MTJ) structure 455, as shown in FIG. 4G. The patterning process is continuously performed until the top surface of the free layer 408 and the top surface of the hardmask layer 416 is exposed. The patterning process selectively etches the dielectric layer 420, leaving the dielectric layer 420 predominately on the sidewalls of the magnetic tunnel junction (MTJ) structure 455 and covering predominately at the locations where the spacer layer 418 is formed. By doing so, the dielectric layer 420 may provide an enhanced protection to the spacer layer 418 as well as creating a contact surface area 435 to the free layer 408. Such contact surface area 435 will later defines a gap (e.g., an air gap) when the magnetic tunnel junction (MTJ) structure 455 is completely formed on the substrate 402.

Figure 4H:
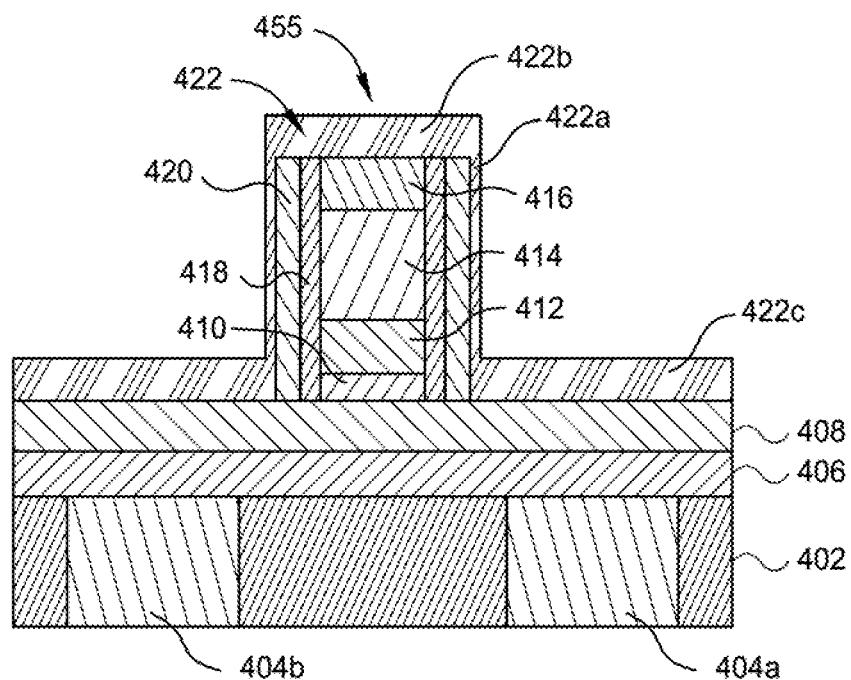
Figure 4:
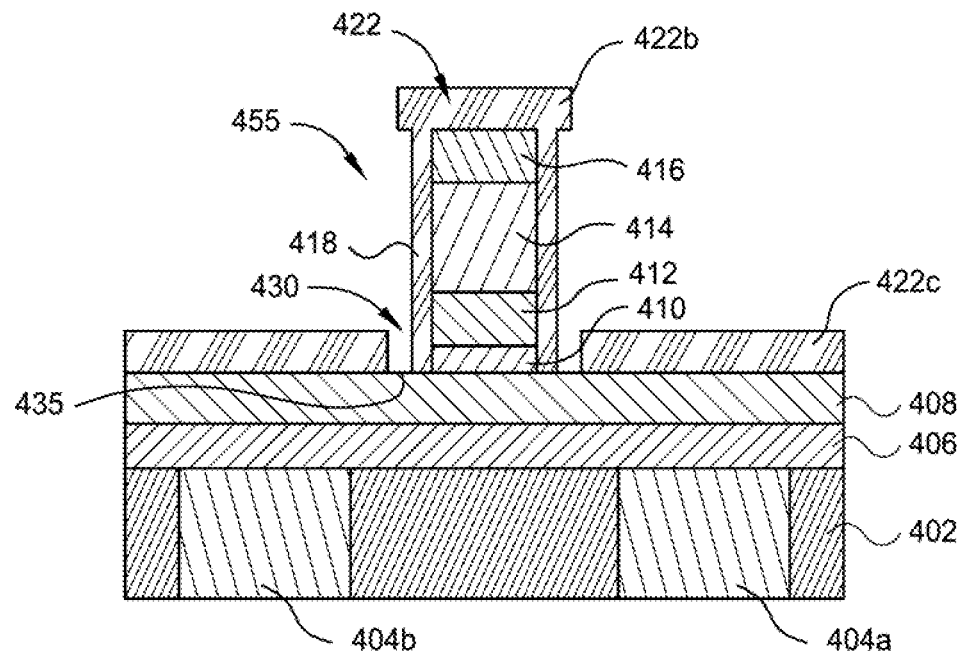

At operation 314, a passivation layer 422 is then formed on the substrate 402, as shown in FIG. 4H. The passivation layer 422 may have a top portion 422b, a sidewall portion 422a, and a bottom portion 422c. The top portion 422b is formed on the top surface of the hardmask layer 116. The sidewall portion 422a is formed lining against the dielectric layer 420 while the bottom portion 422c is formed on the top surface of the free layer 408, as shown in FIG. 4H. The passivation layer 422 is non-conformally formed on the substrate 402, having a relatively a higher thickness on the top portion 422b and the bottom portion 422c of the passivation layer 422, as compared to the thickness of the sidewall portion 422a. The thickness variations among different locations of the passivation layer 422 can provide different degrees of protection to different locations of the substrate 402 during the subsequent etching or patterning processes. Thus, by non-conformally forming the passivation layer 422, the sidewall portion 422a of the passivation layer 422 may be intentionally formed at a relatively thin thickness, so as to selectively remove predominately the dielectric layer 420 without overly attacking the top portion 422b and the bottom portion 422c of the passivation layer 422.

In one example, the passivation layer 422 is also fabricated from an insulating material different from the dielectric layer 420. The different materials utilized to form the passivation layer 422 and the dielectric layer 420 may assist the etching selectivity during the subsequent patterning process. In one example, the passivation layer 422 may be an insulating material, such as a SiN, SiOC, SiON, SiOC, SiO$_2$, SiC amorphous carbon, or other suitable insulating materials as needed. In one particular example, the passivation layer 422 is a silicon nitride (SiN) layer while the dielectric layer 420 is a silicon oxide ($SiO_2$) layer.

At operation 316, a lateral etching process is performed to predominately etch the sidewall portion 422a of the passivation layer 422 as well as the dielectric layer 420 lining against the sidewalls of the magnetic tunnel junction (MTJ) structure 455, as shown in FIG. 4I. The lateral etching process remove predominately the sidewall portion 422a of the passivation layer 422 as well as the dielectric layer 420, leaving the top portion 422b and the bottom portion 422c of the passivation layer 422 on the hardmask layer 416 and the free layer. The remaining portions (e.g., the top portion 422b and the bottom portion 422c) of the passivation layer 422 may be later utilized as an etching mask layers in the following patterning process to complete the forming of the magnetic tunnel junction (MTJ) structure 455. As the top portion 422b and the bottom portion 422c of the passivation layer 422 are remained on the substrate 402 to assist transferring features into the free layer 408 in the subsequent patterning process, additional lithography processes may be eliminated, thus reducing likelihood of misalignment from the lithography process.

The patterning process at operation 316 removes the sidewall portion 422a of the passivation layer 422 as well as the dielectric layer 420, forming a gap 430 (e.g., an air gap) at the location where the sidewall portion 422a of the passivation layer 422 and the dielectric layer 420 used to locate, as shown in FIG. 4I. As the dielectric layer 420 is removed, the contact surface area 435, where the dielectric layer 420 contacted the free layer 408, is then exposed, forming the gap 430. The dimension of the gap 430 is substantially similar to the combination of the thickness of the dielectric layer 420 as well as the thickness of the sidewall portion 422a of the passivation layer 422. In one example, the gap 430 may has a width between about 10 nm and about 50 nm. It is noted that the gap may be a circular structure (e.g., a ring) surrounding the magnetic tunnel junction (MTJ) structure 455.

Figure 4J:
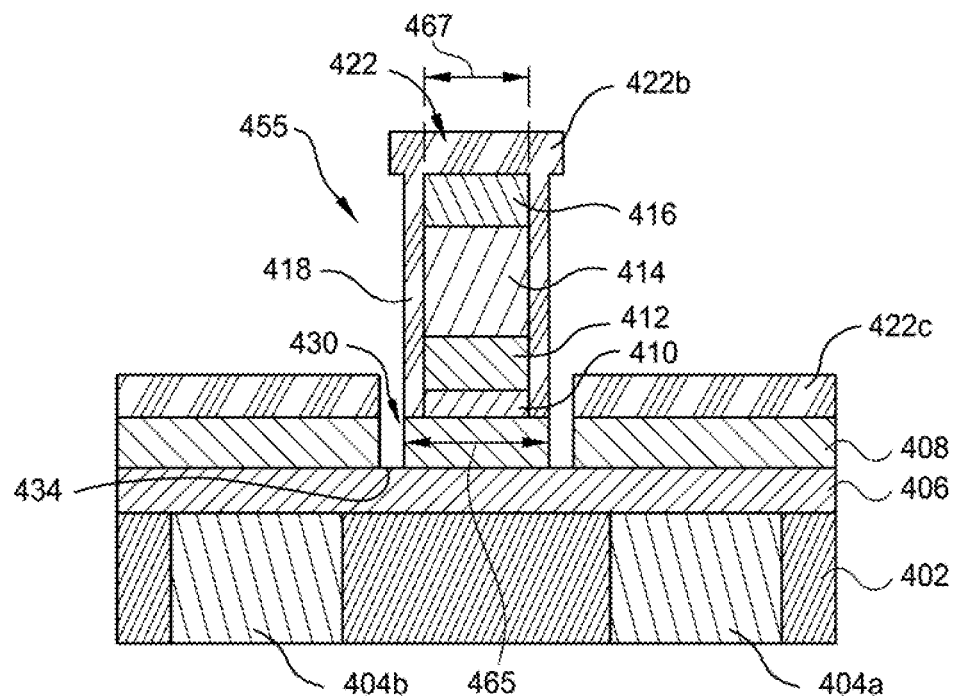
Figure 7:
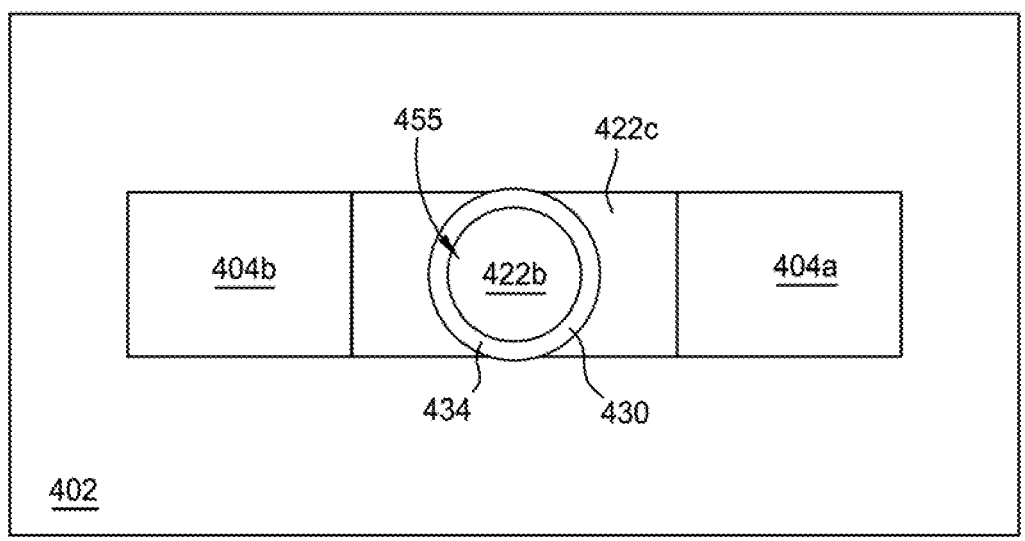
FIG. 7 depicts an embodiment of a top view of a magnetic tunnel junction (MTJ) structure.

At operation 318, a patterning process is further performed to etch the free layer 408 exposed by the patterning bottom portion 422c of the passivation layer 422, as shown in FIG. 4J. The patterning process etches the free layer 408, thus extending the gap formed in the bottom portion 422c of the passivation layer 422 into the free layer 408. The patterning process is continuously performed until a top surface 434 of the SOT layer 406 is exposed. Thus, the magnetic tunnel junction (MTJ) structure 455 is completed after the patterning process at operation 318 and the gap 430 is then formed in the bottom portion 422c of the passivation layer 422 and the free layer 408. In a top view shown in FIG. 7 depicting the final structure of FIG. 4J, the gap 430 is formed as a circular structure surrounding the magnetic tunnel junction (MTJ) structure 455. The top portion 422b of the passivation layer 422 is remained on the magnetic tunnel junction (MTJ) structure 455 while the bottom portion 422c of the passivation layer 422 is remained on the substrate 402 between the interconnection structure 404a, 404b. The gap 430 discontinues the passivation layer 422 and the free layer 408, particularly, so that the discontinued free layer 408 may provide stray magnetic field to the magnetic tunnel junction (MTJ) structure 455 when magnetized. By doing so, the conventional external magnetic field generating structure, such as additional free layers, or magnetic layers generating magnetic field in different directions (e.g., perpendicular to the magnetic tunnel junction (MTJ) structure 455) may be eliminated so as to reduce manufacturing cost, complexity as well as maintaining or even enhancing the desired device performance.

As the spacer layer 418 is lining on the sidewall of the magnetic tunnel junction (MTJ) structure 455 and on the free layer 408, the width 465 of the free layer 408 defined in the magnetic tunnel junction (MTJ) structure 455 is greater than in combination of the thickness of the spacer layer 418 (e.g., including both sidewalls) and the width 467 of the patterned magnetic tunnel junction (MTJ) structure 455, including patterned tunneling barrier layer 410, patterned reference layer 412, patterned synthetic antiferromagnetic free (SAF) layer 414 and the hardmask layer 416. Thus, the resultant magnetic tunnel junction (MTJ) structure 455 including the bottom discontinued free layer 408 having the width 465 greater than the width 467 of other layers (e.g., the tunneling barrier layer 410, the reference layer 412, the synthetic antiferromagnetic free (SAF) layer 414 and the hardmask layer 416) defined in the magnetic tunnel junction (MTJ) structure 455.

Figure 5:
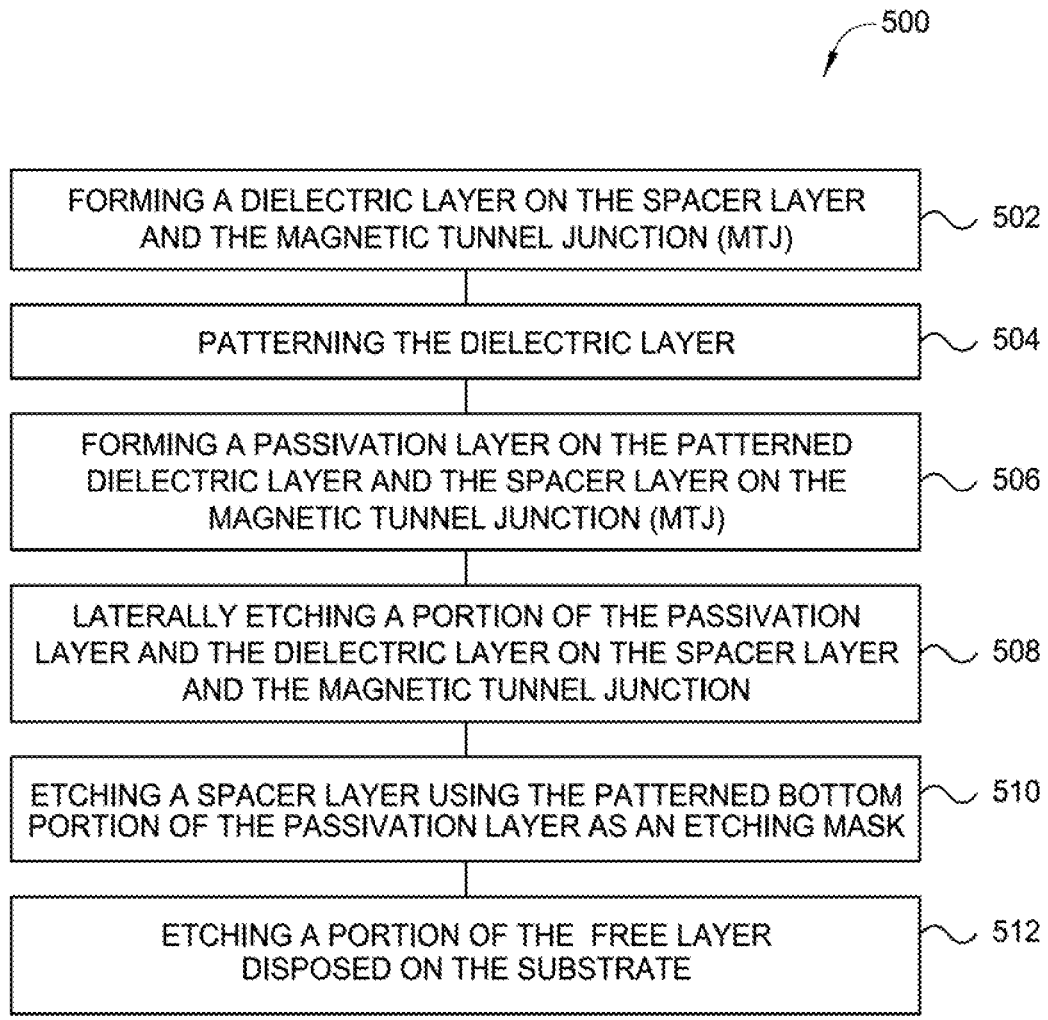
FIG. 5 is a cross sectional view of another example of a magnetic tunnel junction (MTJ) structure formed on a substrate.

FIG. 5 depicts another example of a flow diagram illustrating a process 500 for manufacturing MTJ structures on a substrate for MRAM applications according to one embodiment of the present disclosure. The process 500 continues to perform after the operation 306 from FIG. 3 with the structure from FIG. 4D. FIG. 6A-6F are schematic cross-sectional views of MTJ structure formed on a substrate 402 at various stages of the process of FIG. 5.

Thus, after the operation 306 from FIG. 3 with the structure of FIG. 4D, the process 300 continues to perform on operation 308 with the structures illustrated from FIGS. 4E-4J. In contrast, alternatively, after the operation 306 from FIG. 3 with the structure of FIG. 4D, the process 500 from FIG. 5 may be performed to continue the manufacturing of the MTJ structures from FIG. 4D.

Figure 6A:
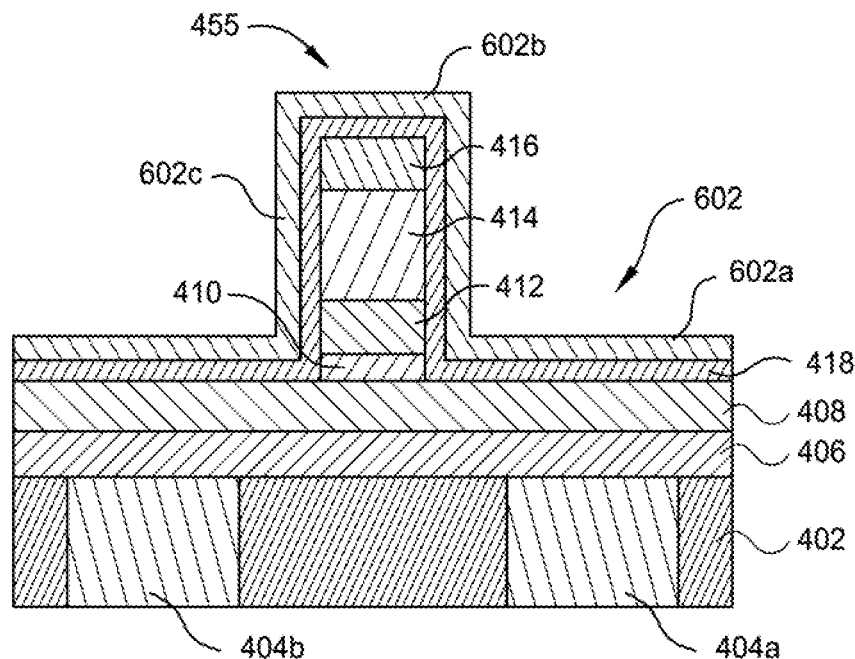
FIGS. 6A-6F are cross sectional views of a substrate at various stages of the method of FIG. 5.

The process 500 starts at operation 502 by forming a dielectric layer 602 on the spacer layer 418 without patterning the spacer layer 418 beforehand, as shown in FIG. 6A. The dielectric layer 602 is conformally formed across the substrate 402, following the profile of the spacer layer 418 formed on the substrate. Similarly, similar to the dielectric layer 420 above, the dielectric layer 602 as formed herein is fabricated from a material different from the spacer layer 418. In one example, the spacer layer 418 is a SiN layer or silicon carbon nitride and the dielectric layer 602 is a $SiO_2$ layer.

The dielectric layer 602 includes a top portion 602b, a sidewall portion 602c and a bottom portion 602a. Similarly, the top portion 602b covers the top surface of the hardmask layer 416 as well as the spacer layer 418. The sidewall portion 602c covers the sidewall of the MTJ structure 455 and the spacer layer 418. The bottom portion 602a forms on the spacer layer 418 as well as on the surface of the free layer 408.

Figure 6B:
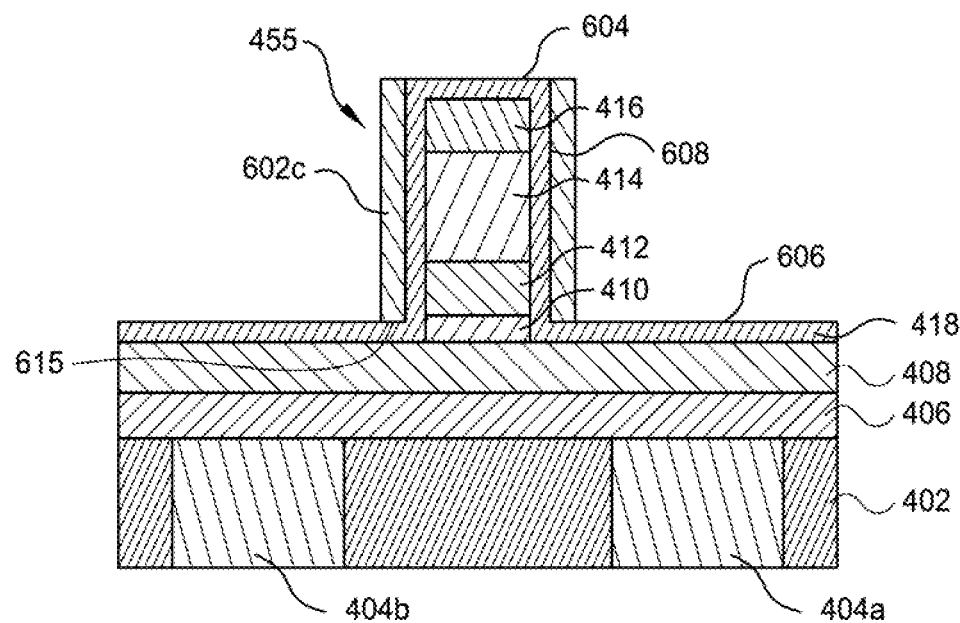

At operation 504, a patterning process is performed to pattern the dielectric layer 602, removing the sidewall portion 602c of the dielectric layer 602 from the magnetic tunnel junction (MTJ) structure 455, as shown in FIG. 6B. The patterning process is continuously performed until the top surface 604 and the bottom upper surface 606 of the spacer layer 418 layer are exposed. The patterning process selectively etches the dielectric layer 602, leaving the sidewall portion 602c of the dielectric layer 602 predominately on the sidewalls 618 of the spacer layer 418 and the magnetic tunnel junction (MTJ) structure 455. By doing so, the sidewall portion 602c of the dielectric layer 602 may provide an enhanced protection to the sidewalls 608 of the spacer layer 418 as well as creating a contact surface area 615 to the bottom upper surface 606 of the spacer layer 418. Such contact surface area 615 will later defines a gap (e.g., an air gap) when the magnetic tunnel junction (MTJ) structure 455 is completely formed on the substrate 402.

Figure 6C:
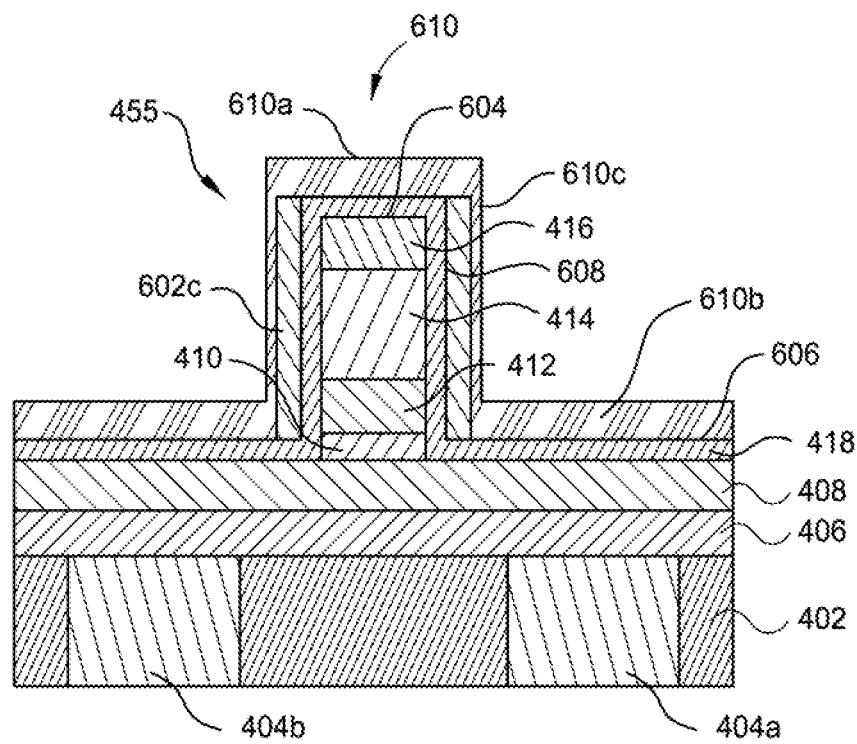

At operation 506, a passivation layer 610 is then formed on the substrate 402, as shown in FIG. 6C. The passivation layer 610 may have a top portion 610a, a sidewall portion 610c, and a bottom portion 610b. The top portion 610a is formed on the top surface 604 of the spacer layer 418. The sidewall portion 610c is formed lining against the sidewall portion 602c of the dielectric layer 602 while the bottom portion 610b is formed on the bottom upper surface 606 of the spacer layer 418, as shown in FIG. 6C. Similar to the passivation layer 422 described above, the passivation layer 610 is non-conformally formed on the substrate 402, having a relatively a higher thickness on the top portion 610a and the bottom portion 610b of the passivation layer 610, as compared to the thickness of the sidewall portion 610c. The thickness variations among different locations of the passivation layer 610 can provide different degrees of protection to different locations of the substrate 402 during the subsequent etching or patterning processes. Thus, by non-conformally forming the passivation layer 610, the sidewall portion 610c of the passivation layer 610 may be intentionally formed at a relatively thin thickness, so as to selectively remove predominately the sidewall portion 602c of the dielectric layer 602 without overly attacking the top portion 610a and the bottom portion 610b of the passivation layer 610.

Similarly, the passivation layer 610 is also fabricated from an insulating material different from the dielectric layer 602. In one example, the passivation layer 610 may be an insulating material, such as a SiN, SiOC, SiON, SiOC, SiO$_2$, SiC amorphous carbon, or other suitable insulating materials as needed. In one particular example, the passivation layer 610 is a silicon nitride (SiN) layer while the dielectric layer 602 is a silicon oxide (SiO$_2$) layer.

Figure 6D:
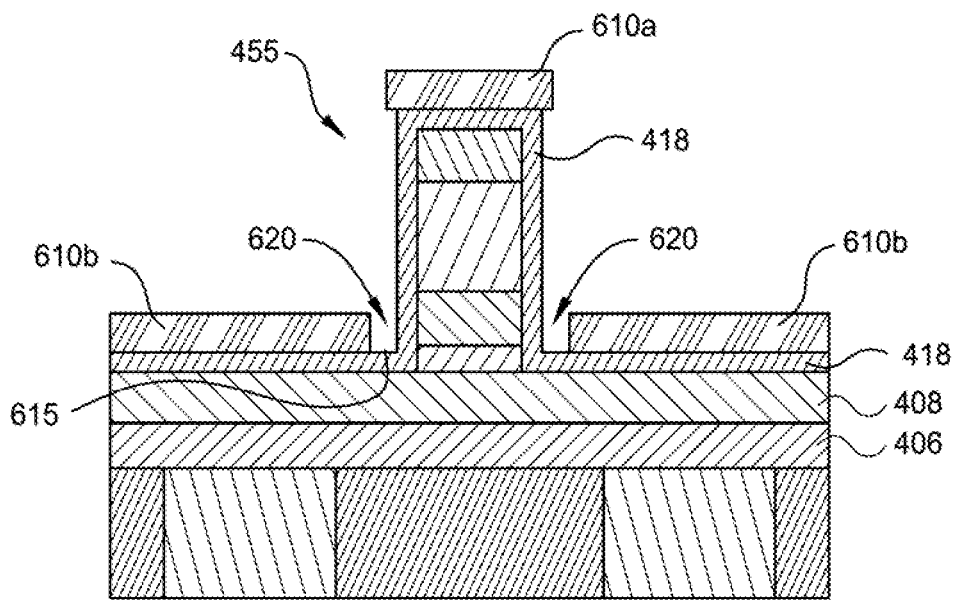

At operation 508, a lateral etching process is performed to predominately etch the sidewall portion 610c of the passivation layer 610 as well as the sidewall portion 602c of the dielectric layer 602 lining against the sidewalls of the magnetic tunnel junction (MTJ) structure 455, as shown in FIG. 6D. The lateral etching process remove predominately the sidewall portion 610c of the passivation layer 610 as well as the sidewall portion 602c of the dielectric layer 602, leaving the top portion 610a and the bottom portion 610b of the passivation layer 610 on the spacer layer 418. The remaining portions (e.g., the top portion 610a and the bottom portion 610b) of the passivation layer 610 may be later utilized as an etching mask layers in the following patterning process to complete the forming of the magnetic tunnel junction (MTJ) structure 455. As the 610a and the bottom portion 610b of the passivation layer 610 are remained on the substrate 402 to assist transferring features into spacer layer 418 and the free layer 408 in the subsequent patterning process, additional lithography processes may be eliminated, thus reducing likelihood of misalignment from the lithography process.

The patterning process at operation 508 removes the sidewall portion 610c of the passivation layer 610 as well as the sidewall portion 602c of the dielectric layer 602, forming a gap 620 (e.g., an air gap) at the location where the sidewall portion 602c of the dielectric layer 602 used to locate, as shown in FIG. 6D. As the dielectric layer 602 is removed, the contact surface area 615, where the dielectric layer 602 contacted the spacer layer 418, is then exposed, forming the gap 620. The dimension (e.g., the width) of the gap 620 is substantially similar to the combination of the thickness of the sidewall portion 610c of the passivation layer 610 as well as the thickness of the sidewall portion 602c of the dielectric layer 602. In one example, the gap 630 may has a width between about 10 nm and about 50 nm. It is noted that the gap may be a circular structure (e.g., a ring) surrounding the magnetic tunnel junction (MTJ) structure 455, similar to the top view shown in FIG. 7 as discussed above.

Figure 6E:
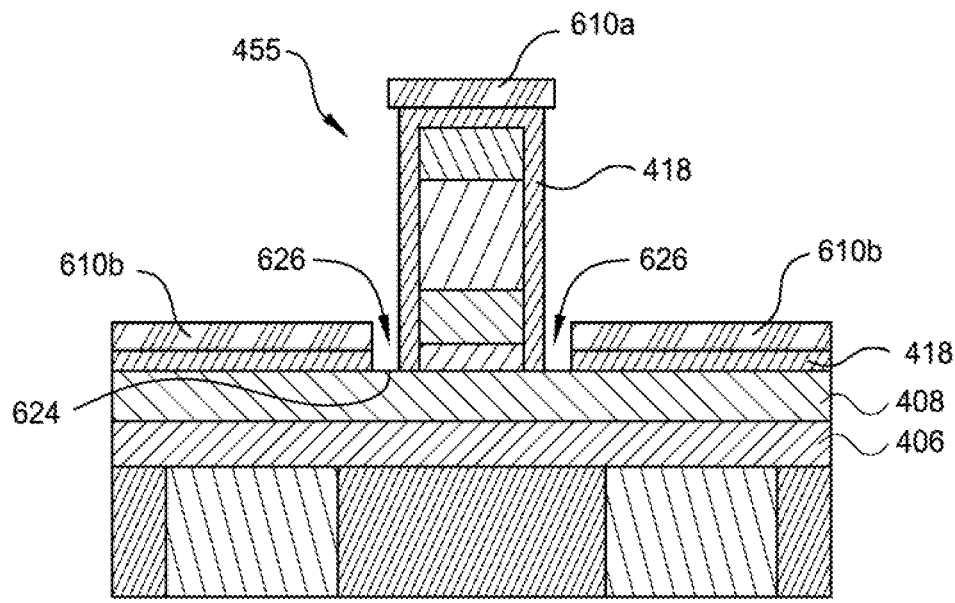
Figure 6F:
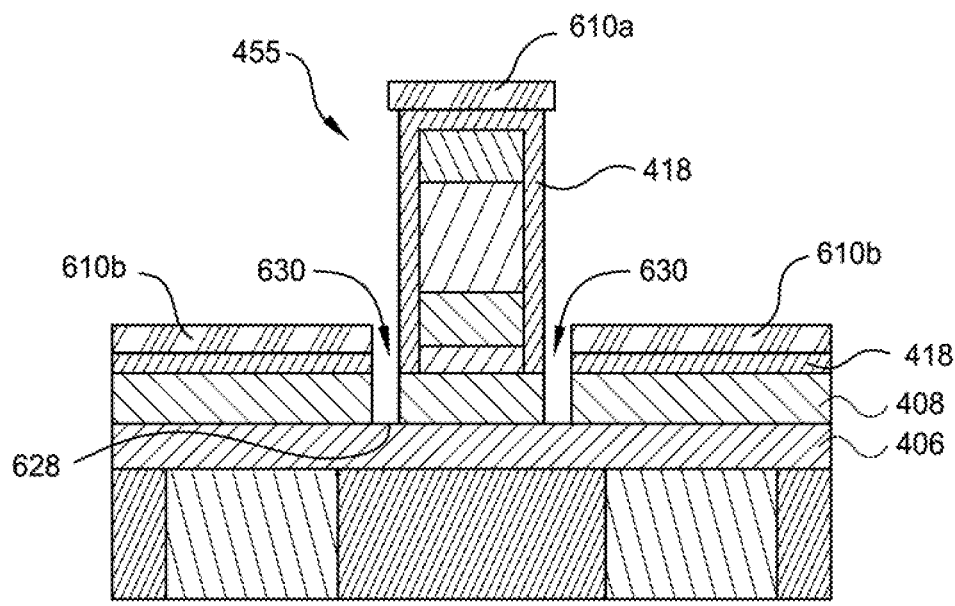

At operation 510, a patterning process is further performed to etch the spacer layer 418, as shown in FIG. 6E, using the bottom portion 610b of the passivation layer 610 as an etching mask, thus extending the gap 626 to be in the spacer layer 418. Subsequently, at operation 512, a patterning process is further performed to etch the free layer 408 exposed by the patterned spacer layer 418, as shown in FIG. 6F, thus extending the gap 630 to be into the free layer 408. The patterning process etches the free layer 408, thus extending the gap 630 into the free layer 408. The patterning process is continuously performed until a top surface 628 of the SOT layer 406 is exposed. Thus, the magnetic tunnel junction (MTJ) structure 455 is completed after the patterning process at operation 512 and the gap 630 is then formed in the bottom portion 610b of the passivation layer 610, the spacer layer 418 and the free layer 408. The gap 630 discontinues the passivation layer 610, the spacer layer 418 and the free layer 408, particularly, so that the discontinued free layer 408 may provide stray magnetic field to the magnetic tunnel junction (MTJ) structure 455 when magnetized. By doing so, the conventional external magnetic field generating structure, such as additional free layers, or magnetic layers generating magnetic field in different directions (e.g., perpendicular to the magnetic tunnel junction (MTJ) structure 455) may be eliminated so as to reduce manufacturing cost, complexity as well as maintaining or even enhancing the desired device performance.

Accordingly, processes and apparatus of forming MTJ device structures for MRAM are provided, particularly for spin orbit torque (SOT) magnetic random access memory (SOT MRAM) applications. In one embodiment, while pattering a film stack for forming the MTJ structure, a gap (e.g., an air gap) is formed around the MTJ structure. The gap (e.g., a discontinued free layer) defined adjacent to the MTJ structure to the nearby film layers so that a stray magnetic field may be provided to the isolated MTJ pillar structure. By doing so, an intrinsic magnetic field may be generated by a discontinuous free layer disposed in the film structure. Thus, an external magnetic field generation may be eliminated, thus reducing manufacturing cost and complexity. Furthermore, as the gap is formed utilizing the patterned film layers from the MTJ pillar structure, no additional photography process is required during the patterning process so that the likelihood of misaligned occurred during a lithography process may be reduced or eliminated.

While the foregoing is directed to embodiments of the disclosure, other and further embodiments of the disclosure may be devised without departing from the basic scope thereof.

What is claimed is:
1. A magnetic tunnel junction (MTJ) device structure, comprising:
   a magnetic tunnel junction (MTJ) pillar structure disposed on a substrate; and
   a gap surrounding the MTJ pillar structure, wherein the gap discontinues in a free layer formed in the magnetic tunnel junction (MTJ) pillar structure.

2. The magnetic tunnel junction (MTJ) device structure of claim 1, wherein magnetic tunnel junction (MTJ) pillar structure further comprises:
a film stack having a reference layer disposed on a tunneling barrier layer formed on the free layer.

3. The magnetic tunnel junction (MTJ) device structure of claim 1, wherein the film stack further comprises:
a synthetic antiferromagnetic free (SAF) layer disposed on the reference layer; and
a hardmask layer disposed on the synthetic antiferromagnetic free (SAF) layer.

4. The magnetic tunnel junction (MTJ) device structure of claim 1, wherein the gap further discontinues in a passivation layer disposed on the free layer.

5. The magnetic tunnel junction (MTJ) device structure of claim 4, wherein a portion of the passivation layer covers a top portion of the magnetic tunnel junction (MTJ) pillar structure.

6. The magnetic tunnel junction (MTJ) device structure of claim 2, wherein the magnetic tunnel junction (MTJ) pillar structure comprises a spacer layer surrounding the film stack.

7. The magnetic tunnel junction (MTJ) device structure of claim 2, wherein the free layer formed in the magnetic tunnel junction (MTJ) pillar structure has a width greater than the width of the film stack.

8. The magnetic tunnel junction (MTJ) device structure of claim 6, wherein the spacer layer is silicon nitride layer or silicon carbon nitride layer.

9. The magnetic tunnel junction (MTJ) device structure of claim 1, wherein the gap has a width between about 10 nm and about 50 nm.

10. The magnetic tunnel junction (MTJ) device structure of claim 4, wherein the gap further discontinues in the passivation layer disposed on a spacer layer and the free layer.

11. The magnetic tunnel junction (MTJ) device structure of claim 10, wherein a portion of the spacer layer covers a top portion of the magnetic tunnel junction (MTJ) pillar structure.

12. A method for forming a magnetic tunnel junction (MTJ) device structure, comprising:
patterning a film stack comprising a reference layer, a tunneling barrier layer and a free layer disposed on the tunneling barrier;
patterning the reference layer and the tunneling barrier layer until the free layer is exposed;
forming a spacer layer covering sidewalls of the patterned reference layer and the tunneling barrier layer;
forming a dielectric layer on the spacer layer covering the spacer layer;
forming a passivation layer covering the dielectric layer; and
selectively etching a portion of the passivation layer and the dielectric layer to form a gap surrounding the film stack.

13. The method of claim 12, further comprising:
performing a patterning process to extend the gap to the free layer in the film stack.

14. The method of claim 12, further comprising:
performing a patterning process to extend the gap to a portion of the spacer layer disposed on the free layer.

15. The method of claim 12, wherein the spacer layer surrounds patterned reference layer and the tunneling barrier layer interfaced with the gap.

16. The method of claim 12, wherein the spacer layer is fabricated from a material different from the dielectric layer.

17. The method of claim 12, wherein the dielectric layer is fabricated from a material different from the passivation layer.

18. The method of claim 13, wherein the gap defined a portion of the free layer under the patterned reference layer and the tunneling barrier layer.

* * * * *